(12) United States Patent
Campbell

(10) Patent No.: US 6,249,163 B1
(45) Date of Patent: Jun. 19, 2001

(54) LOGIC CIRCUITS

(75) Inventor: Eric R Campbell, Hertfordshire (GB)

(73) Assignee: Matra BAe Dynamics (UK) Limited, Hertfordshire (GB)

( * ) Notice: Subject to any disclaimer, the term of this patent is extended or adjusted under 35 U.S.C. 154(b) by 0 days.

(21) Appl. No.: 09/080,212

(22) Filed: May 18, 1998

Related U.S. Application Data

(63) Continuation of application No. PCT/GB96/02815, filed on Nov. 15, 1996.

(30) Foreign Application Priority Data

Nov. 16, 1995 (GB) .................................................. 9523393

(51) Int. Cl.[7] .................................................. H03K 3/356
(52) U.S. Cl. .......................................... 327/218; 327/225
(58) Field of Search .................................. 327/199, 200, 327/210, 211, 212, 215, 216, 217, 218, 219, 225

(56) References Cited

U.S. PATENT DOCUMENTS

| | | | |
|---|---|---|---|
| 4,002,933 | * | 1/1977 | Leuschner .............................. 327/216 |
| 4,156,154 | * | 5/1979 | Iizuka .................................... 327/215 |
| 5,004,933 | | 4/1991 | Widener ................................. 327/141 |
| 5,781,053 | * | 7/1998 | Ramirez ................................. 327/215 |

FOREIGN PATENT DOCUMENTS

| | | | |
|---|---|---|---|
| 38 1313816 A1 | | 11/1989 | (DE) . |
| 1-13808 | * | 1/1989 | (JP) ..................................... 327/225 |

OTHER PUBLICATIONS

"A Scan Design for Asynchronous Sequential Logic Circuits Using SR–Latches", Shieh, Ming–Der et al, pp. 1300–1303, Proceedings of the Midwest Symposium on Circuits and Systems, Detroit, Aug. 16, 1993, vol. 2, Institute of Electrical and Electronics Engineers.

* cited by examiner

Primary Examiner—Tuan T. Lam
(74) Attorney, Agent, or Firm—Nixon & Vanderhye P.C.

(57) ABSTRACT

A transparent latch, having a signal input D, an output Q and a control input C for selecting one of two operating modes, functions by either allowing the output to follow the input (in an enable mode) or by blocking any subsequent changes in input signal level (in an inhibit mode). Owing to the design of the latch, relative propagation delays through gates and interconnecting wires cannot cause a wrong value to be latched, this being in contrast with known arrangements. Therefore constraints on the physical layout of the latch are removed. In one embodiment the latch comprises two pairs of NAND gates (5,6,7,8) each pair being connected in a feedback configuration.

7 Claims, 1 Drawing Sheet

LOGIC CIRCUITS

This is a continuation of PCT application No. PCT/GB96/02815, filed Nov. 15, 1996.

BACKGROUND OF THE INVENTION

1. Field of the Invention

This invention relates to digital electronic circuits and in particular to transparent latches.

2. Discussion of Prior Art

A transparent latch is a digital function which has one signal input (D), one signal output (Q) and a control input C.

The control input is used to select one of two modes of operation. In a first mode, the output (Q) changes to follow any changes in the input (D). In the second mode, the output remains set to the input condition existing at the point of mode change.

The above function can be represented by either of the following Boolean expression:

$$Q=D.C+Q.\bar{C}$$

when the first mode is such that C is true: or by its dual:

$$Q=D.\bar{C}+Q.C$$

when the first mode is such that C is false

The above expressions can be realised in a number of known ways, one of which is shown in FIG. 1. The transparent latch of FIG. 1 and other known versions are described in Texas instruments Data Book Vol I 1989.

The truth table (where H=true and L=false) for the circuit of FIG. 1 is as below:

| D | C | Q |
|---|---|---|
| H | H | H |
| L | H | L |
| H | L | $Q_0$ |
| L | L | $Q_0$ | i.e. when the control input (C) is high, the latch is transparent, with Q following D, and when the control input (C) is low the output Q remains latched at its previous level $Q_o$.

The circuit of FIG. 1 comprises first and second AND gates 1, 2 whose outputs are fed to an OR gate 3 which provides the final output Q. Inputs D and C are fed to the first AND gate 1 while the second AND gate 2 receives the final output Q and $\bar{C}$ as inputs. $\bar{C}$ is derived from C by means of an inverter/NOT gate 4.

As can readily be seen from inspection of FIG. 1, the OR gate 3 makes the choice between D or the existing value of Q, the choice being controlled by the current state of C, this being the principle of operation of all known transparent latches.

It will also be noted that for correct operation of the circuit under all possible conditions, particular care must be taken in the layout of the latch so that propagation delays through gates and interconnecting wires and are accounted for. This constraint on the design layout is inherent in all known latches. If these propagation delays are not properly accounted for then a failure condition can occur. For example, when the control input (C) is high and D is high, the input to gate 3 from gate 1 will be high and the input to gate 3 from gate 2 will be low. If the control input (C) is now taken low and the input to gate 3 from gate 1 goes low before the input to gate 3 from gate 2 goes high, the output (Q) can be erroneously latched low.

SUMMARY OF THE INVENTION

An object of this invention is to provide a transparent latch design in which the above constraint is removed.

Accordingly, this invention comprises a transparent latch having a signal input, D, an operating mode control input, C, and an output, Q, and including logic gate means for allowing the output signal level to follow the input signal level in a first operating mode, and for blocking any level change in the input signal from propagating through to the output in a second operating mode. A transparent latch in accordance with the invention will always latch the correct value no matter what combination of propagation delays through gates or wires (or switching speed of gates) exist in the physical realisation.

In contrast with known transparent latches, the present invention does not use a control signal C and its inverse $\bar{C}$, but just one control, C. Owing to the design of the latch of the present invention, relative propagation delays through gates and interconnecting wires do not affect the value latched, therefore there are no constraints on its physical layout.

Also in contrast with known devices which latch by selecting the existing output level, the latch of the present invention stays latched by blocking any subsequent changes in signal input level.

In a specific embodiment, the latch consists of two pairs of logic gates in which the output of each gate comprising a pair is fed back to the input of the other gate comprising the same pair. The control input, C, is applied to both pairs, with the signal input, D, being applied just to a first pair. The output of the first pair is then connected to an input of the second.

BRIEF DESCRIPTION OF THE DRAWINGS

The above and other objects and advantages of the present invention will become more apparent by reference to the following drawings wherein.

DETAILED DISCUSSION OF PREFERRED EMBODIMENTS

Figure 1:
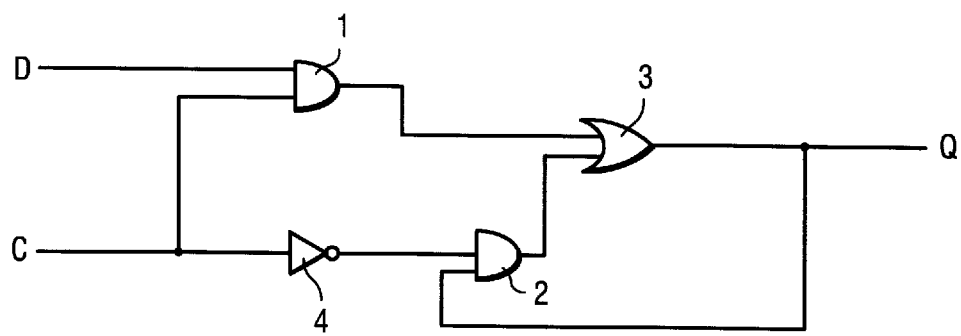
FIG. 1 is an electrical schematic of a prior art transparent latch.
Figure 2:
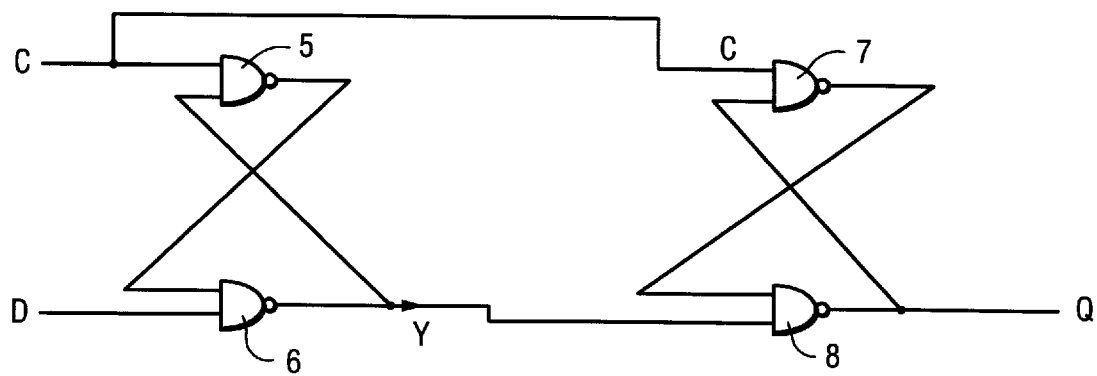
FIG. 2 is an electronic schematic of a transparent latch in accordance with the present invention.

FIG. 2 is logic diagram of a transparent latch which consists of four NAND gates 5, 6, 7, 8, each gate having two inputs.

A control signal C is fed into a first input of gates 5 and 7 and a signal input D is fed into a first input of gate 6.

The output Y of gate 6 is fed back into the second input of gate 5 and the output of gate 5 is applied to the second input of gate 6.

The output Y of gate 6 is also applied to a first input of gate 8 whose output Q is fed back to the second input of gate 7. The output of gate 7 is fed to the second input of gate 8.

Thus the latch has two inputs; D, the signal input and C, a control input; and one output Q. The latch operates so that the output Q either follows the signal input D or remains set irrespective of changes in D, depending on the state of the control input, C.

A truth table for the transparent latch of FIG. 2 is shown below. In this example, H=true and L=false for D and Q: and H=false and L=true for C.

| Operation Condition | C | D | $Q_o$ | Q |
|---|---|---|---|---|
| 1) enable | L | H | X | H |
| 2) enable | L | L | X | L |
| 3) inhibit | H | H | H | H |
| 4) inhibit | H | L | L | L |
| 5) inhibit | H | ⊓ | H | H |
| 6) inhibit | H | ⊔ | L | L |

The Boolean function for the transparent latch of FIG. 2 can be written:

$$Q = \overline{[D \cdot \overline{(C \cdot Y)}] \cdot [\overline{C \cdot Q}]}$$

with the gates 5 and 6 performing the function:

$$Y = \overline{D \cdot \overline{(C \cdot Y)}}$$

and the gates 7 and 8 performing the function $$Q = \overline{Y \cdot \overline{C \cdot Q}}$$

The transparent latch of FIG. 2 operates as follows:

There are two modes of operation. When the control input C is low, the latch is transparent with the output Q following the input D. When C is high, the output Q is latched at the value that existed before C changed state i.e. $Q_o$. In this Latter, "inhibit" mode any changes in D are prevented from getting through to the output.

Referring now to the truth table in conjunction with FIG. 2. Under conditions 1 and 2 i.e. an "enable" condition, with the control input C low, the outputs of gates 5 and 7 will always be high, irrespective of the existing levels of Y and Q. Thus, the gates 6 and 8 allow the inverse of their inputs (D and Y respectively) through to their outputs. Hence Q will always follow D as long as C is low.

Under conditions 3 and 4, control input C is now high (which is an inhibit condition) and the value of D remains as it was before any change of state of C (i.e. D=$Q_o$). Taking the case where D=1, when C changes from low to high, there will be no change of state in the outputs of gates 5 and 6, but gate 7 output will change to low. However, with Y still held low, gate 8 will maintain Q high.

Under condition 4 where D=0, when C changes from low to high, the output of gate 5 will go low. However with D low, Y is maintained high at the output of gate 6. The output states of gates 7 and 8 remain as they were when C was low and so Q is maintained low.

Conditions 5 and 6 refer to situations where C is set to high i.e. inhibit and the level of D changes while C is still high. These changes are blocked from reaching the output Q by the action of the gates as explained below.

When D moves from high to low, both gates 5 and 6 change their output states, with Y moving from low to high. However, because the second input of gate 8 is low, the change in Y is blocked from getting through and altering the state of the output Q. Hence, due to the combined actions of gates 7 and 8 Q remains latched at $Q_o$ (high).

Finally, under condition 6 when D moves from low to high, gates 5 and 6 ensure that this change cannot be propagated. Thus Y remains high with no possible changes to the states of gates 7 and 8. Hence Q remains latched at $Q_o$ (low).

While the transparent latch of the specific example has been configured using four NAND gates, it will be appreciated by those skilled in the art that other combinations of gates whose Boolean functions are identical with that of the circuit of FIG. 2 will achieve the same result.

What is claimed is:

1. A transparent latch having a signal input (D), an operating mode control signal (C) and an output (Q), the latch comprising four logic gates in which: the control signal (C) and the output from a first gate (6) are connected to the inputs of a second gate (5);

the signal input (D) and output from the second gate (5) are connected to the inputs of the first gate;

the control signal (C) and the output from a third gate (8) are connected to the inputs of a fourth gate (7);

the output of the first gate (6) and the output of the fourth gate (7) are connected to the inputs of the third gate (8), wherein the output (Q) of the latch is taken from the output of the third gate (8) whereby in a first operating mode, dependent upon the logic state of the control signal (C), the logic state of the signal input (D) propagates through to the output Q, and in a second operating mode, dependent upon the logic state of the control signal (C) any logic level change in the signal input (D) is blocked from reaching the output (Q).

2. A transparent latch according to claim 1 in which the logic gates are NAND gates (5, 6, 7, 8).

3. A transparent latch having a signal input (D), an operating mode control signal (C) having at least two operating modes, and a latch output (Q), said latch comprising first, second, third, and fourth logic gates, each logic gate having at least two inputs and at least one output:

said first logic gate has said signal input (D) connected as one input and said second logic gate at least one output connected as a second input;

said second logic gate has said control signal (C) and said first logic gate output connected to said at least two second logic gate inputs;

said third gate has said first logic gate at least one output and said fourth logic gate output connected to said at least two third logic gate inputs; and said fourth logic gate has said control signal (C) and said at least one output from said third logic gate connected to said at least two inputs of said fourth logic gate, wherein said latch output (Q) is taken from said third logic gate at least one output, said logic gates adapted such that in a first of said at least two operating modes, the logic state of the signal input (D) propagates through to the latch output (Q), and in a second of said at least two operating modes, any logic level change in the signal input (D) is blocked from reaching the latch output (Q).

4. The transparent latch according to claim 3, wherein each logic gate has only two inputs and only one output.

5. The transparent latch according to claim 4, wherein each logic gate is a NAND gate.

6. The transparent latch according to claim 3, wherein the first and second logic gates perform the Boolean function $$Y = \overline{D \cdot (\overline{C \cdot Y})};$$

the third and fourth logic gates perform the Boolean function $$Q = \overline{Y \cdot \overline{C \cdot Q}};$$ and in combination, all four logic gates perform the Boolean function $$Q = \overline{[\overline{D \cdot (\overline{C \cdot Y})}] \cdot [\overline{C \cdot Q}]}.$$

7. The transparent latch according to claim 3, wherein the logic gates operate in accordance with the following truth table in which H=true and L=false for signal input (D) and latch output (Q) and H=false and L=true for operating mode control signal (C):

| Operation Condition of C | C | D | $Q_o$ | Q |
|---|---|---|---|---|
| 1) enable | L | H | X | H |
| 2) enable | L | L | X | L |
| 3) inhibit | H | H | H | H |
| 4) inhibit | H | L | L | L |
| 5) inhibit | H | decrease | H | H |
| 6) inhibit | H | increase | L | L |

* * * * *